（12） United States Patent
Sawada et al.

(10) Patent No.: US 7,465,915 B2
(45) Date of Patent: Dec. 16, 2008

(54) MEASURING METHOD OF INCIDENT LIGHT AND SENSOR HAVING SPECTROSCOPIC MECHANISM EMPLOYING IT

(75) Inventors: Kazuaki Sawada, Toyohashi (JP); Makoto Ishida, Toyohashi (JP); Yuki Maruyama, Toyohashi (JP); Hideki Muto, Odawara (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 202 days.

(21) Appl. No.: 10/561,954

(22) PCT Filed: Mar. 25, 2004

(86) PCT No.: PCT/JP2004/004210

§ 371 (c)(1),
(2), (4) Date: May 17, 2006

(87) PCT Pub. No.: WO2004/113854

PCT Pub. Date: Dec. 29, 2004

(65) Prior Publication Data

US 2006/0244089 A1        Nov. 2, 2006

(30) Foreign Application Priority Data

Jun. 23, 2003    (JP) ............................ 2003-177425

(51) Int. Cl.
*G01J 3/50* (2006.01)
*H01L 27/00* (2006.01)
*H01L 29/861* (2006.01)

(52) U.S. Cl. .................... 250/226; 250/208.1; 257/443; 257/458

(58) Field of Classification Search ............ 250/227.23, 250/226, 208.1–208.6, 214.1; 356/300–334; 257/440, 443, E27.132, E25.006, 458, 461, 257/80
See application file for complete search history.

(56) References Cited

U.S. PATENT DOCUMENTS 4,345,021 A * 8/1982 Ogawa et al. ............... 430/321

(Continued)

FOREIGN PATENT DOCUMENTS

JP          5-343661        12/1993

(Continued)

OTHER PUBLICATIONS

Gusmao, M. S. et al., "Field-effect transistors as tunable infrared detectors", Journal of Applied Physics, vol. 79, No. 5, pp. 2752-2754, 1996.

*Primary Examiner*—Georgia Y. Epps
*Assistant Examiner*—Jennifer Bennett
(74) *Attorney, Agent, or Firm*—Oblon, Spivak, McClelland, Maier & Neustadt, P.C.

(57) ABSTRACT

A method for measuring incident light employing a simple semiconductor structure provided with a single electron-capturing section corresponding to incident light, and a sensor having a spectroscopic mechanism employing the same are provided. A spectroscopic sensor includes a semiconductor substrate (1), a first diffusion layer (2) provided on the semiconductor substrate (1), a second diffusion layer (3)provided at a part of the first diffusion layer (2), and an electrode (7)film provided on the first diffusion layer (2) with an insulating film (4) provided therebetween, the electrode film (7) transmitting the incident light and being applied with a gate voltage. In the spectroscopic sensor, the gate voltage is varied, the depth (position) for capturing electrons generated in the first diffusion layer (2) by the incident light is varied so as to correspond to the gate voltage, and a current indicating the quantity of the electrons is measured. Thereby, wavelength and intensity of the incident light are measured.

12 Claims, 8 Drawing Sheets

U.S. PATENT DOCUMENTS

| | | | | |
|---|---|---|---|---|
| 4,677,289 A | * | 6/1987 | Nozaki et al. | 250/226 |
| 4,896,049 A | * | 1/1990 | Ogawa | 250/226 |
| 5,581,094 A | * | 12/1996 | Hara et al. | 257/80 |
| 5,726,440 A | * | 3/1998 | Kalkhoran et al. | 250/214.1 |

FOREIGN PATENT DOCUMENTS

| | | |
|---|---|---|
| JP | 7-058324 | 3/1995 |
| JP | 09-237887 | 9/1997 |
| JP | 2001-007323 | 1/2001 |

* cited by examiner

Vg=1V

Vg=2V

Vg=3V

Vg=4V

Vg=5V

MEASURING METHOD OF INCIDENT LIGHT AND SENSOR HAVING SPECTROSCOPIC MECHANISM EMPLOYING IT

TECHNICAL FIELD

The present invention relates to a method for measuring incident light and a spectroscopic sensor employing the same, and in particular, to a method for measuring incident light, the method for detecting wavelength and intensity of light incident on a semiconductor device, and a sensor having a spectroscopic mechanism employing the same.

BACKGROUND ART

In an image sensor used in single-CCD video cameras, red, green, and blue filters are provided on each photo detector (e.g., photodiode) to produce color images.

In three-CCD video cameras, incident light is separated into three light components, i.e., red, green, and blue with an optical prism and each of the light components is detected with three separate image sensors.

Hitherto, in order to check wavelength and intensity of incident light, a spectroscopic separation is performed using a grating or the like and the intensity distribution of each light component is then measured with a power meter or the like.

A trial for obtaining color information of red, green, and blue with a single photodiode is also known (refer to Patent Document 1 below). According to this approach, three diffusion layers having a depth of 0.2 µm, 0.6 µm, and 2 µm are disposed on a silicon substrate so as to overlap with each other, and currents generated from each junction are detected.

[Patent Document 1]
U.S. Pat. No. 5,965,875 (the fourth column to the fifth column, FIG. 6)

DISCLOSURE OF INVENTION

However, in the above-described single-CCD video cameras, since three photo detectors are required to produce color images, the resolution is decreased to one third. In addition, the sensitivity is decreased because of an optical absorption by the color filters.

In the three-CCD video cameras, the presence of the optical prism increases the size of the camera itself.

Furthermore, the size of the spectroscopic instrument is increased because a grating or the like is used.

In the method of color separation by an active pixel imaging array having a triple-well structure, which is disclosed in Patent Document 1, red is also unintentionally detected in the nearest junction that detects blue, and thus the resolution of color information of red, green, and blue is low. Furthermore, disadvantageously, this method does not provide information about the relationship between wavelength and intensity.

Also, in the method described in Patent Document 1, the depth (position) of electrons to be captured cannot be varied.

In view of the above situation, it is an object of the present invention to provide a method for measuring incident light employing a simple semiconductor structure provided with a single electron-capturing section corresponding to incident light, and a sensor having a spectroscopic mechanism employing the same.

In order to achieve the above object, the present invention provides the following items:

[1] In a method for measuring incident light, the method employs a semiconductor structure including an electrode film transmitting incident light and being applied with a gate voltage, and a diffusion layer for capturing electrons generated by the incident light, the diffusion layer being disposed under the electrode film with an insulating film provided therebetween. In the method, the gate voltage is varied, the depth from the surface of the diffusion layer in which electrons are captured is varied, and a current indicating the quantity of the electrons is measured, thereby measuring wavelength and intensity of the incident light.

[2] In the method for measuring incident light described in item [1], the number of times of varying the gate voltage is set according to the type of the incident light.

[3] A spectroscopic sensor includes a semiconductor substrate; a first diffusion layer provided on the semiconductor substrate; a second diffusion layer provided at a part of the first diffusion layer; and an electrode film provided on the first diffusion layer with an insulating film provided therebetween, the electrode film transmitting incident light and being applied with a gate voltage. In the spectroscopic sensor, the first diffusion layer in which electrons generated by the incident light are captured is varied so as to correspond to the gate voltage, and a current indicating the quantity of the electrons is measured, thereby measuring wavelength and intensity of the incident light.

[4] In the spectroscopic sensor described in item [3], the first diffusion layer includes a p-type diffusion layer, the second diffusion layer includes an $n^+$ diffusion layer, and the semiconductor substrate includes an n-type semiconductor substrate.

[5] In the spectroscopic sensor described in item [3], the electrode film being applied with a gate voltage is a polycrystalline silicon film doped with an impurity.

[6] A spectroscopic sensor array including the spectroscopic sensors described in item [3] being disposed one dimensionally or two-dimensionally is provided. The spectroscopic sensor array is switched with a shift register formed with the spectroscopic sensor array to read signals, the depth for capturing electrons is varied to measure signals at each time, and the intensities of wavelengths of red, green, and blue are calculated from the signals to output color image signals.

[7] In a color image sensor without a color filter described in item [6], a noise-eliminating circuit is provided at an output part of the color image signals.

[8] In a color image sensor without a color filter described in item [6], the depth for capturing electrons is varied every $1/180$ seconds.

BEST MODE FOR CARRYING OUT THE INVENTION

Figure 1:
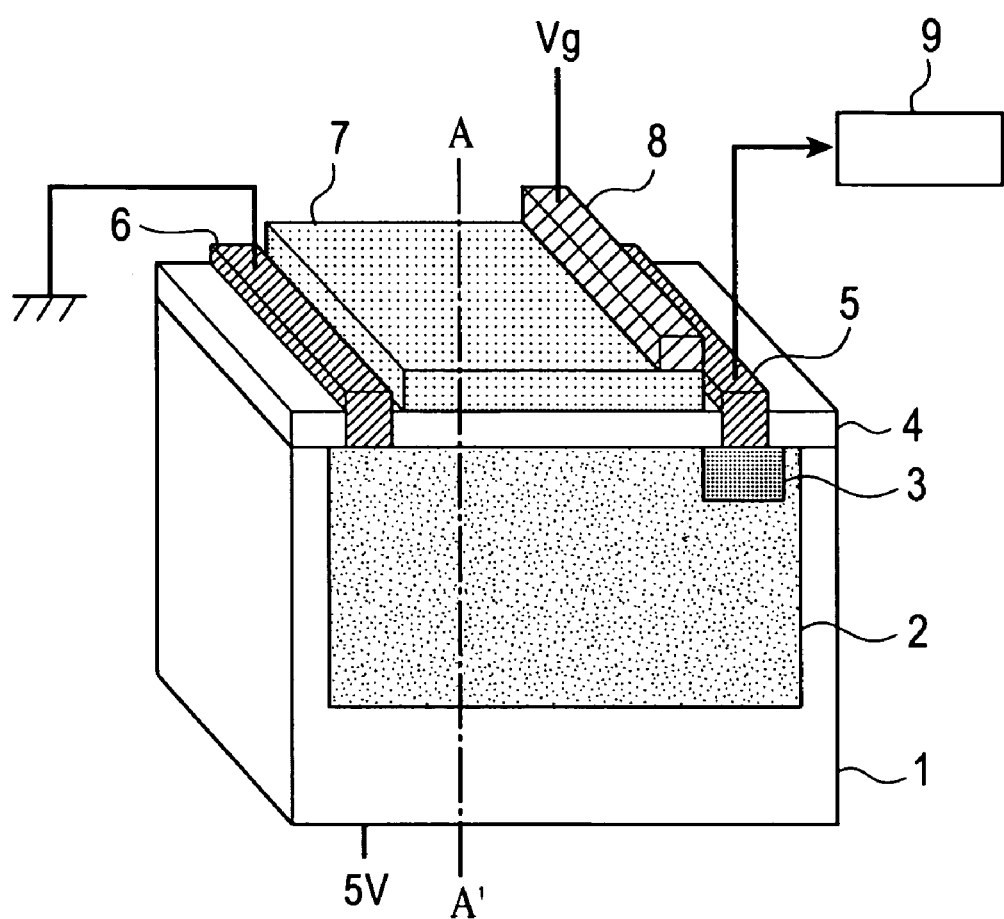
FIG. 1 is a perspective view showing a partial cross-sectional view of a spectroscopic sensor that measures incident light, according to an embodiment of the present invention.

Embodiments of the present invention will now be described in detail.

First, a fundamental principle for obtaining wavelength information of incident light will be described.

Light irradiated on a semiconductor device enters the semiconductor device and is attenuated while being absorbed. The degree of attenuation depends on the wavelength of the incident light.

Consequently, the present invention focuses attention on the following: If a depth (position) capable of collecting electrons generated by light can be varied and the currents thereof can then be measured, wavelength information of incident light can be obtained by the following method (of course, electron holes that are simultaneously formed with the electrons may be accumulated). For example, suppose that two light components having wavelengths of $\lambda 1$ and $\lambda 2$ are simultaneously incident with intensities of $A_1$ and $A_2$, respectively. Suppose that when the current generated by electrons in a distance from the surface to an electron-capturing position $W_1$ is measured, the current is represented by current $I_1$.

Subsequently, suppose that when the current generated by electrons in a distance to an electron-capturing position $W_2$ is measured, the current is represented by current $I_2$. This phenomenon can be represented by the following equations [refer to Supplementary explanation 1]:

[Equation 1] (1)

$$\begin{cases} I_1 = \frac{A_1 S q}{h\nu_1}(1 - e^{-\alpha_1 W_1}) + \frac{A_2 S q}{h\nu_2}(1 - e^{-\alpha_2 W_1}) \\ I_2 = \frac{A_1 S q}{h\nu_1}(1 - e^{-\alpha_1 W_2}) + \frac{A_2 S q}{h\nu_2}(1 - e^{-\alpha_2 W_2}) \end{cases}$$

In the equations, each parameter is as follows:
$A_1$ and $A_2$: intensity of incident light [W/cm$^2$]
S: sensor area [cm$^2$]
$W_1$ and $W_2$: electron-capturing position [cm]
$\alpha_1$ and $\alpha_2$: absorption coefficient at each wavelength [cm$^{-1}$]

$I_1$: observed value of current [A] when the electron-capturing position is $W_1$
$I_2$: observed value of current [A] when the electron-capturing position is $W_2$
Frequency $\nu_1 = c/\lambda_1$
Frequency $\nu_2 = c/\lambda_2$ Here, c represents the light velocity, S represents an area of light-receiving section, h$\nu$ represents photon energy, and q represents an electron volt. All the values except for the intensities $A_1$ and $A_2$ of incident light are known values. Accordingly, the intensities $A_1$ and $A_2$ of incident light can be determined by solving simultaneous equations from the two equations.

For example, the intensities $A_1$ and $A_2$ of incident light are represented as follows:

[Equation 2] (2)

$$\begin{cases} A_1 = \frac{I_1 Z - I_2 X}{WZ - XY} \\ A_2 = \frac{I_2 W - I_1 Y}{WZ - XY} \end{cases}$$

Each parameter is as follows:

[Equation 3] (3)

$$W = \frac{Sq(1 - e^{-\alpha_1 W_1})}{h\nu_1} \quad X = \frac{Sq(1 - e^{-\alpha_2 W_1})}{h\nu_2}$$
$$Y = \frac{Sq(1 - e^{-\alpha_1 W_2})}{h\nu_1} \quad Z = \frac{Sq(1 - e^{-\alpha_2 W_2})}{h\nu_2}$$

For example, when incident light is separated into three wavelengths, a current $I_3$ when the electron-capturing position is $W_3$ is added to equation (1). Subsequently, the calculation is performed as in the case of two wavelengths, thus separating the incident light into three wavelengths.

Similarly, when light incident with 100 wavelengths is spectroscopically separated, the electron-capturing position should be varied 100 times and the measurement is then performed.

[Supplementary Explanation 1]

When monochromatic light is incident, a current generated to a depth (position) W in a semiconductor can be determined by a calculation. When light is incident on a semiconductor, the light intensity is exponentially attenuated. Accordingly, a light intensity Φ at a depth x is represented as follows:

[Equation 4]

$$\Phi = \Phi_0 e^{-\alpha x} \quad (4)$$

wherein $\Phi_0$: intensity of incident light [W/cm$^2$]
α: absorption coefficient [cm$^{-1}$]

From this equation, the ratio absorbed to a depth W is determined as follows:

[Equation 5] (5)

$$\frac{\int_0^W \phi_0 e^{-\alpha x} dx}{\int_0^\infty \phi_0 e^{-\alpha x} dx} = 1 - e^{-\alpha W}$$

From these equations, a current generated to the depth W is determined by the following equation:

[Equation 6]

$$I = \frac{\phi_0 S q}{h\nu}(1 - e^{-\alpha W})$$ (6)

wherein S: area [cm²] of light-receiving section
hv: photon energy [J]
q: electron volt [J]

It is equation (1) that these equations are represented with respect to each wavelength.

Embodiments of the present invention will now be described in detail.

FIG. 1 is a perspective view showing a partial cross-sectional view of a spectroscopic sensor that measures incident light, according to an embodiment of the present invention.

In this figure, reference numeral 1 indicates an n-type silicon substrate (n-type substrate), reference numeral 2 indicates a p-type diffusion layer (p-type well) formed in the n-type silicon substrate 1, reference numeral 3 indicates an n+ diffusion layer formed at a part of the p-type diffusion layer 2, reference numeral 4 indicates a silicon oxide ($SiO_2$) film formed on the p-type diffusion layer 2, reference numeral 5 indicates an Al electrode connected to the n+ diffusion layer 3 and being applied with a reference voltage, reference numeral 6 indicates an electrode that is connected to the p-type diffusion layer 2 and is connected to ground, reference numeral 7 indicates a polycrystalline silicon (poly-Si) film formed on the upper part of the silicon oxide film 4 and being doped with an impurity, and reference numeral 8 indicates a gate electrode connected to the polycrystalline silicon film 7. The polycrystalline silicon film 7 functions as an electrode capable of transmitting light via the silicon oxide film 4.

In order to vary a depth (position) from the surface of the p-type diffusion layer 2 in which electrons are captured, for example, the spectroscopic sensor has a structure in which the p-type diffusion layer 2 is provided in the n-type silicon substrate 1 and the polycrystalline silicon (poly-Si) film 7 doped with an impurity and functioning as an electrode capable of transmitting light via the silicon oxide film 4 disposed on the upper part of the p-type diffusion layer 2 is disposed. The n+ diffusion layer 3 is disposed beside the polycrystalline silicon film 7 capable of transmitting light and being doped with an impurity in order that captured electrons are taken out to the outside. The p-type diffusion layer 2 and the n-type silicon substrate 1 include contacts for extending wiring to keep the electric potential of these constant.

Figure 2:
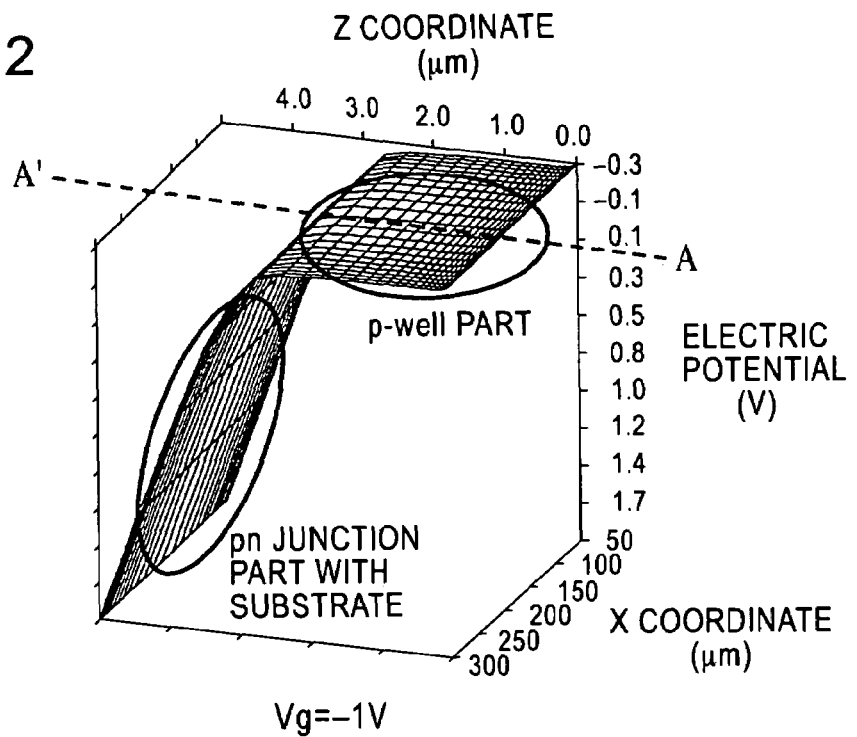
FIG. 2 is a characteristic diagram of the spectroscopic sensor in the case where Vg is −1 V.
Figure 3:
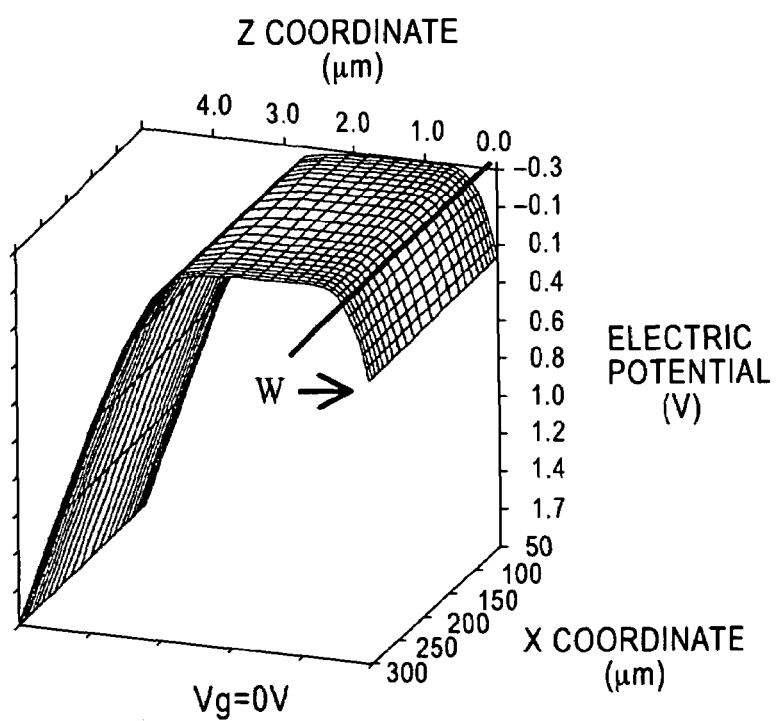
FIG. 3 is a characteristic diagram of the spectroscopic sensor in the case where Vg is 0 V.
Figure 4:
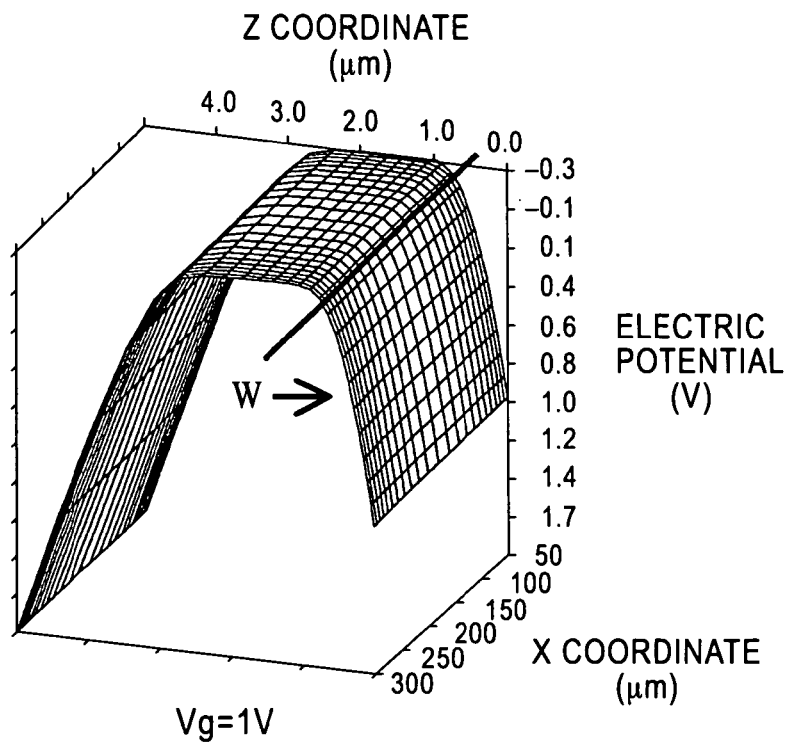
FIG. 4 is a characteristic diagram of the spectroscopic sensor in the case where Vg is 1 V.
Figure 5:
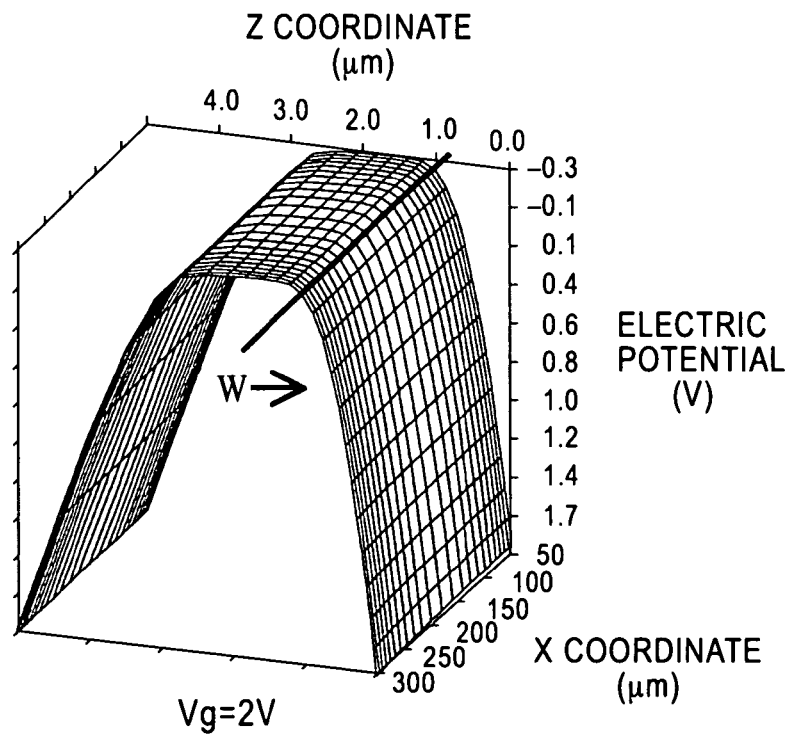
FIG. 5 is a characteristic diagram of the spectroscopic sensor in the case where Vg is 2 V.
Figure 6:
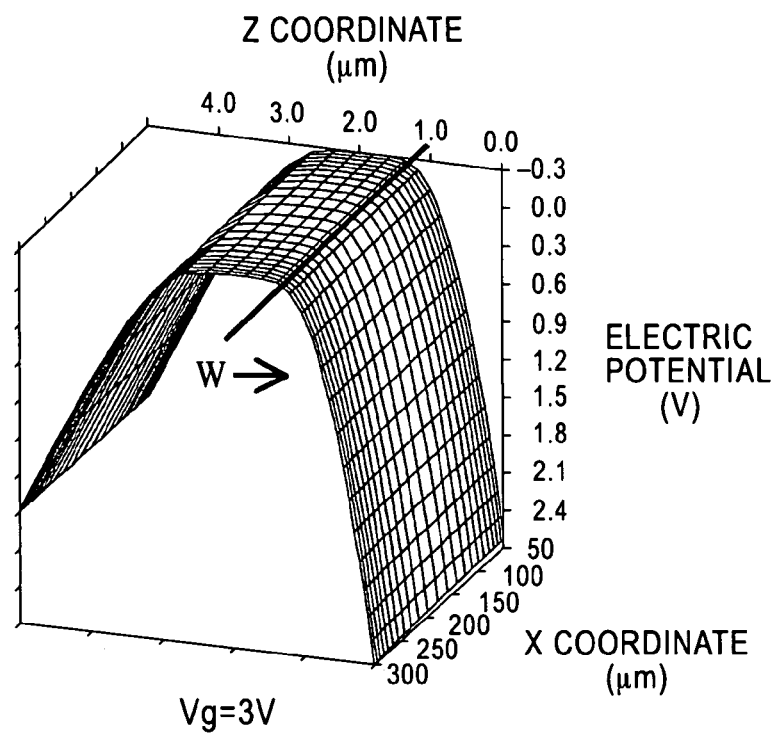
FIG. 6 is a characteristic diagram of the spectroscopic sensor in the case where Vg is 3 V.
Figure 7:
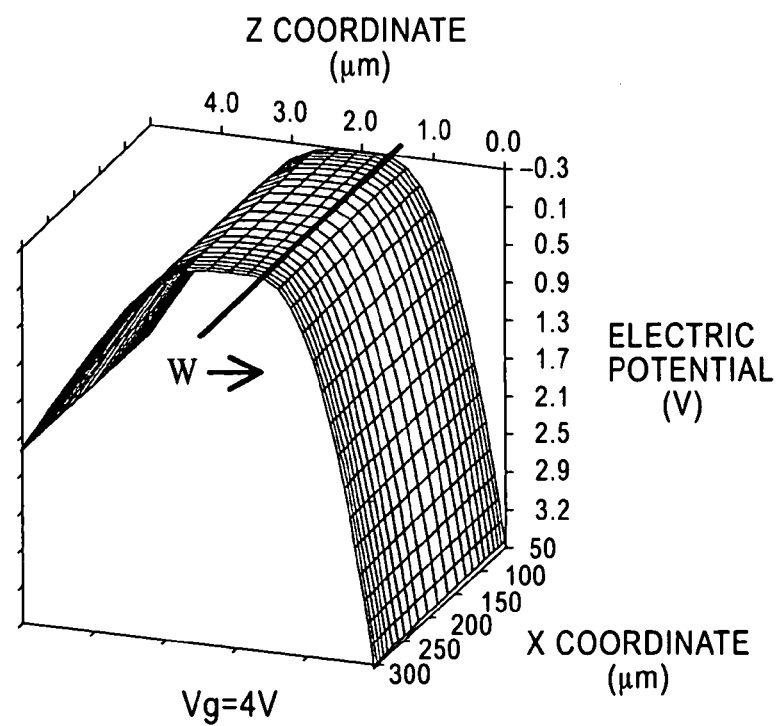
FIG. 7 is a characteristic diagram of the spectroscopic sensor in the case where Vg is 4 V.
Figure 8:
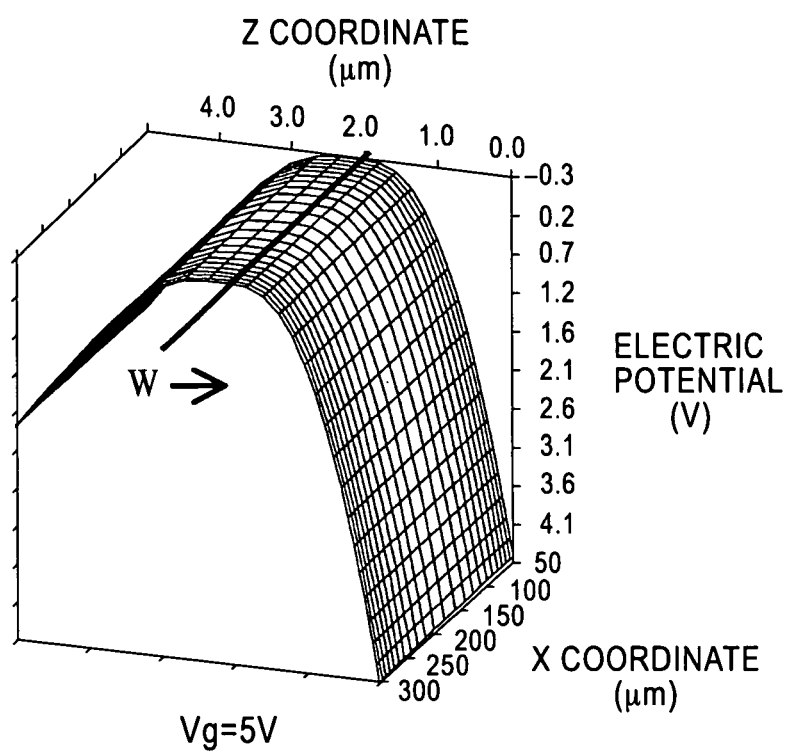
FIG. 8 is a characteristic diagram of the spectroscopic sensor in the case where Vg is 5 V.

FIGS. 2 to 8 are characteristic diagrams of the spectroscopic sensor shown in FIG. 1. FIG. 2 shows the case where Vg is −1 V, FIG. 3 shows the case where Vg is 0 V, FIG. 4 shows the case where Vg is 1 V, FIG. 5 shows the case where Vg is 2 V, FIG. 6 shows the case where Vg is 3 V, FIG. 7 shows the case where Vg is 4 V, and FIG. 8 shows the case where Vg is 5 V. Here, Vg represents a gate voltage(electric potential of the gate electrode 8). In each figure, the value 0.0 in the Z coordinate axis represents the surface of the p-type diffusion layer, the actual line represents a depth (position) W from the surface of the p-type diffusion layer in which electrons are captured, B represents a p-well part, and C represents a pn junction part with the substrate (these are representatively shown in FIG. 2 but are the same in FIGS. 3 to 10).

For example, in the case where the concentration of impurity in the p-type diffusion layer 2 is $2 \times 10^{15}$ cm$^{-3}$ (junction depth: 5 μm), the concentration of impurity in the n-type silicon substrate 1 is $1.5 \times 10^{14}$ cm$^{-3}$, and the thickness of the silicon oxide film 4 is 65 nm, when the electric potential of the gate electrode 8 is varied from −1 V to 5 V (FIG. 2 to FIG. 8) (while 5 V is applied on the n-type silicon substrate 1), the depth W from the surface of the p-type diffusion layer 2 in which electrons are captured, is varied from 0 μm to 2.3 μm.

The figures show the results of a simulation when 5 V is applied on the silicon substrate 1. However, the voltage applied on the substrate is not fixed to 5 V but is variable.

Figure 9:
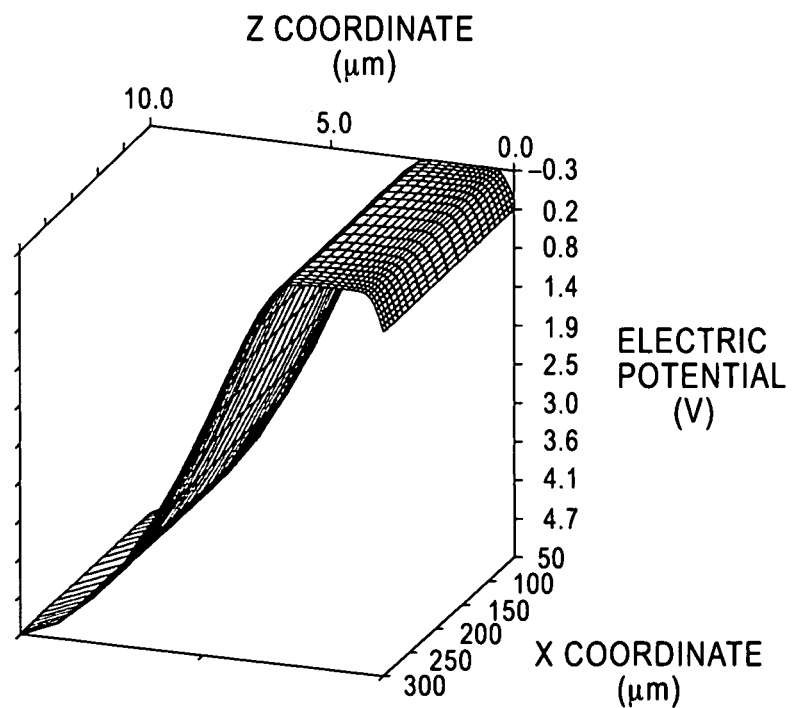
FIG. 9 is a characteristic diagram of a spectroscopic sensor according to an embodiment of the present invention in the case where the voltage applied to a substrate is 5 V and Vg is 0 V (corresponding to FIG. 3), and the depth of a p-type diffusion layer is 10 μm (full scale in the Z coordinate).
Figure 10:
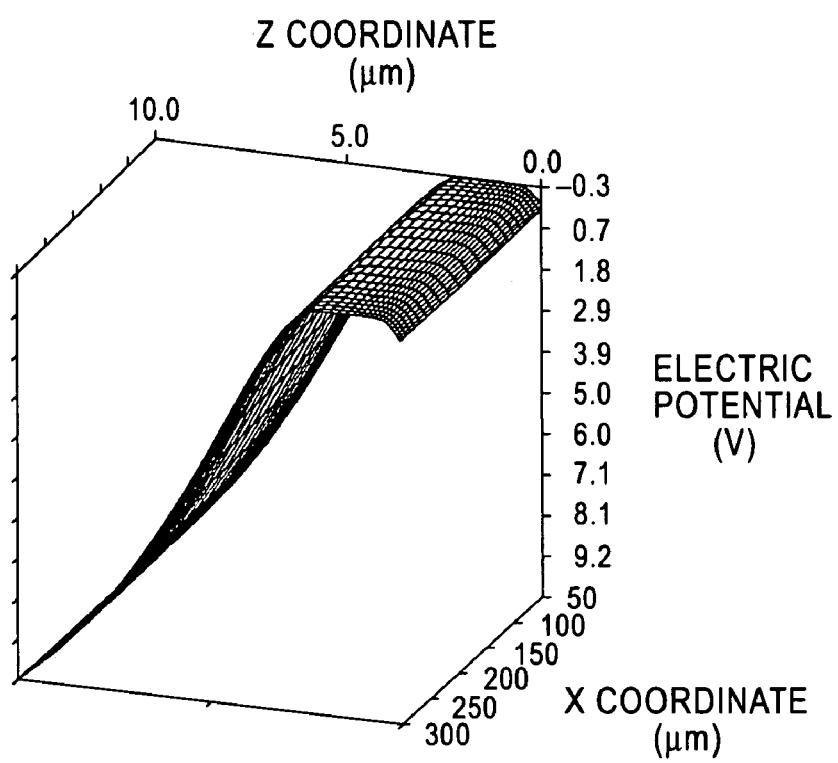
FIG. 10 is a characteristic diagram of the spectroscopic sensor according to the embodiment of the present invention in the case where the voltage applied to the substrate is 10 V and Vg is 0 V, and the depth of the p-type diffusion layer is 10 μm (full scale in the Z coordinate).

FIG. 9 is a characteristic diagram of a spectroscopic sensor according to an embodiment of the present invention in the case where the voltage applied to the substrate is 5 V and Vg is 0 V (corresponding to FIG. 3), and the depth of the p-type diffusion layer is 10 μm (full scale in the Z coordinate). FIG. 10 is a characteristic diagram of the spectroscopic sensor according to the embodiment of the present invention in the case where the voltage applied to the substrate is 10 V and Vg is 0 V, and the depth of the p-type diffusion layer is 10 μm (full scale in the Z coordinate). In these figures, the value 0.0 in the Z coordinate axis represents the surface of the p-type diffusion layer and the value 10.0 in the Z coordinate axis represents the bottom surface of the p-type diffusion layer (the surface of the silicon substrate). When FIG. 9 and FIG. 10 are compared, the variation in the voltage applied on the substrate somewhat affects the pn junction part C with the substrate, the p-well part B, and the depth W from the surface of the p-well in which electrons are captured (mainly, the degree of decrease in the pn junction part C with the substrate is increased), but a significant difference does not occur. Therefore, in the present invention, the function of the spectroscopic sensor can be carried out by varying Vg while the voltage applied on the substrate is constant, thereby varying the depth W from the surface of the diffusion layer in which electrons are captured.

Figure 11:
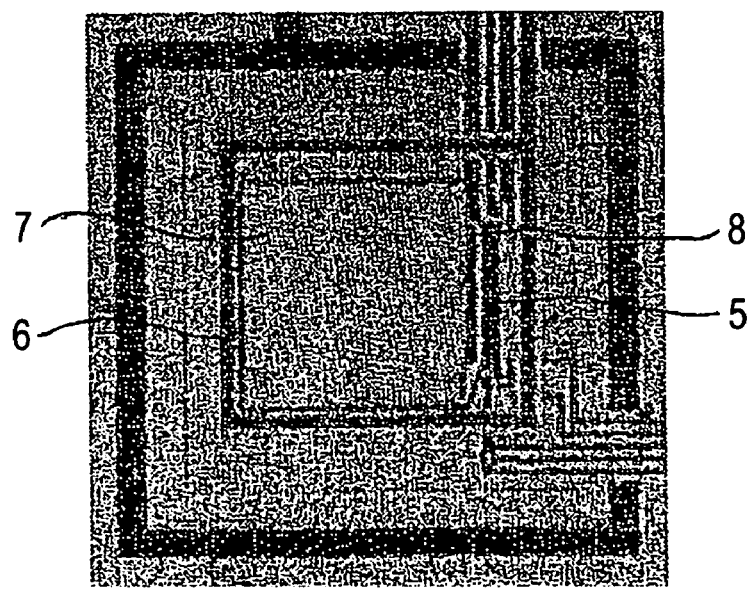
FIG. 11 is a plan view of a unit of a spectroscopic sensor of the present invention.
Figure 12:
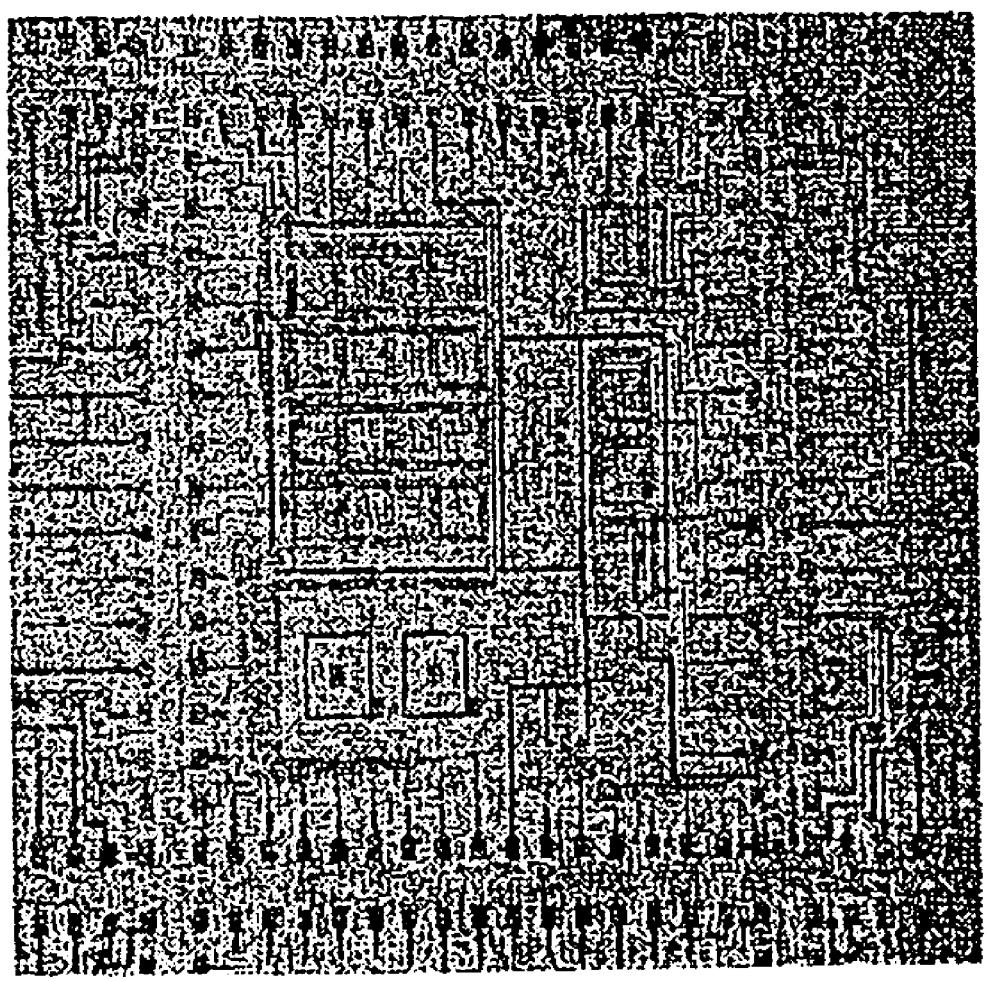
FIG. 12 is a plan view of the overall spectroscopic sensors (4×4) of the present invention.

FIGS. 11 and 12 show (photographs of) spectroscopic sensors having this structure, which have been actually produced. FIG. 11 shows a plan view of a unit of the spectroscopic sensor and FIG. 12 shows a plan view of the overall spectroscopic sensors (4×4).

Table 1 shows a measurement result in the device actually produced according to the present invention using two types of light-emitting diodes (blue and red) whose wavelengths are actually known.

TABLE 1

| | Blue (λ = 470 nm) | Red (λ = 640 nm) | Signal ratio (blue/red) |
|---|---|---|---|
| Intensity of incident light [μW/cm²] | 271 | 861 | 0.315 |
| Detection result [μW/cm²] | 222 | 712 | 0.312 |

As is apparent from Table 1, although the absolute values of intensity of light are shifted from those that were actually incident, the ratios of the signals were the same. When optical reflection is considered, the detection can be accurately performed.

[Example of Measuring Method]

When three types of incident light are incident, the measurement is performed as follows:

(1) For example, a gate voltage of 1 V is applied to the polycrystalline silicon film 7 transmitting incident light and being doped with an impurity being applied with the gate voltage. The current flowing at the time is read.

(2) Subsequently, a gate voltage of 2 V is applied to the polycrystalline silicon film 7 and the current flowing at the time is read.

(3) Subsequently, a gate voltage of 5 V is applied to the polycrystalline silicon film 7 and the current flowing at the time is read.

(4) The intensities in each wavelength of the incident light are calculated by the above equations on the basis of the resulting current values.

As described above, hitherto, a mechanical instrument such as a grating is necessary to separate the wavelength of light. In contrast, according to the spectroscopic sensor of the present invention, wavelengths of incident light can be plotted with a resolution of 100 by performing the measurement while the depth (position) for capturing electrons in the diffusion layer is varied a plurality of times (e.g., 100 times). Thus, the light can be divided into wavelengths and a grating or the like is not required.

Furthermore, the present invention can be used for the following applications.

EXAMPLE 1

Color Image Sensor without Color Filter

Figure 13:
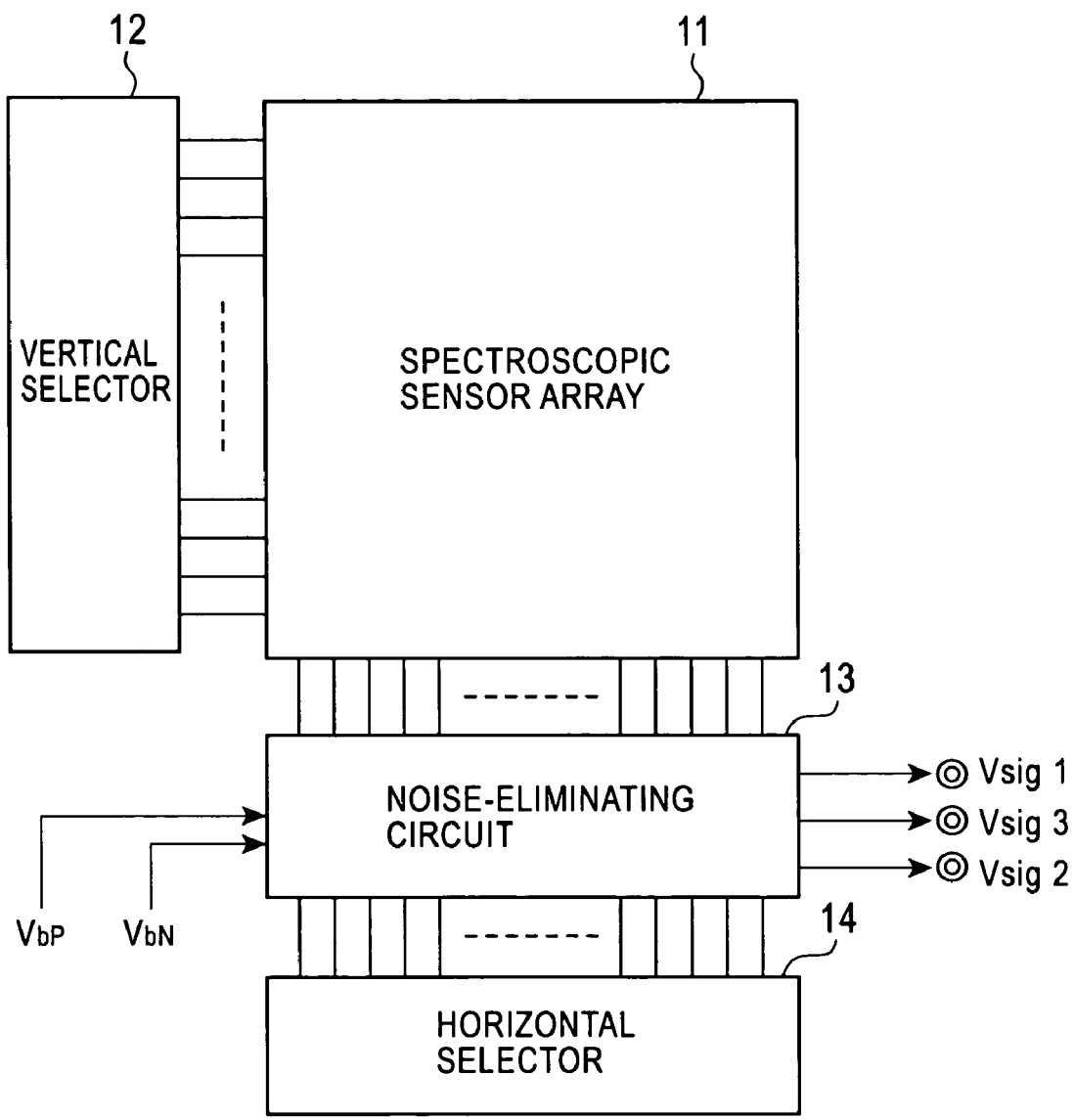
FIG. 13 is a block diagram of a color image sensor system without a color filter, according to an application of the present invention.

FIG. 13 is a block diagram of a color image sensor system without a color filter, according to an application of the present invention.

In the figure, reference numeral 11 indicates a spectroscopic sensor array, reference numeral 12 indicates a vertical selector (v. scanner), reference numeral 13 indicates a noise-eliminating circuit (column CDS), reference numeral 14 indicates a horizontal selector (h. scanner), Vsig1 indicates an optical signal output 1, Vsig2 indicates an optical signal output 2, Vsig3 indicates an optical signal output 3, and $V_{bN}$ and $V_{bP}$ indicate biases for low current driving.

Thus, the spectroscopic sensors of the present invention are arrayed one-dimensionally or two-dimensionally and the spectroscopic sensor array 11 is switched with a shift register formed therewith to read signals. In order to suppress noise during each switching, the noise-eliminating circuit 13 is also mounted on an output part of the signals. For example, the depth (position) for capturing electrons is varied every 1/180 seconds and signals at each time are measured. The intensities of wavelengths of red, green, and blue are calculated from the signals to output color image signals.

EXAMPLE 2

Fluorescent Sensor

Bio-reactions generally utilize fluorescent reactions. In general, fluorescence is generated by irradiating light (excitation light) having a short wavelength and the resulting fluorescence is observed. A band pass filter that does not transmit the excitation light but transmits only the fluorescence is used in general image sensors because the fluorescence is hidden by the excitation light. Consequently, the instrument has large dimensions.

Use of the spectroscopic sensor of the present invention allows only fluorescence excluding excitation light to be measured without using a band pass filter.

The present invention is not limited to the above examples. Various modifications can be made on the basis of the purpose of the present invention and those modifications are not excluded from the scope of the present invention.

As described in detail, the present invention can provide the following advantages.

(A) A method for measuring incident light employing a simple semiconductor structure provided with a single electron-capturing section corresponding to incident light, and a spectroscopic sensor employing the same are provided.

(B) A color image sensor without a color filter can be provided as an application of the spectroscopic sensor.

INDUSTRIAL APPLICABILITY

A method for measuring incident light according to the present invention and a sensor having a spectroscopic mechanism employing the same can be used as a spectroscopic sensor and a color image sensor without a color filter, which is an application of the spectroscopic sensor.

The invention claimed is:

1. A spectroscopic sensor comprising:
   (a) a semiconductor substrate;
   (b) a first diffusion layer provided on the semiconductor substrate;
   (c) a second diffusion layer for taking out electrons captured in the first diffusion layer to the outside, the second diffusion layer being provided at one end of the first diffusion layer;
   (d) a first electrode that is connected to the second diffusion layer and that takes out the captured electrons to the outside;
   (e) a second electrode that is connected to another end opposing to the second diffusion layer of the first diffusion layer and that establishes an electric potential of the first diffusion layer;
   (f) an electrode film provided on the first diffusion layer with an insulating film provided therebetween, the electrode film transmitting incident light and being applied with a gate voltage; and
   (g) means that measures wavelength and intensity of the incident light by determining a light intensity ($\Phi$) at a depth x from the surface of the first diffusion layer on the basis that the light intensity is exponentially attenuated when light is incident on the first diffusion layer, determining the ratio of the intensity of the intensity of the incident light absorbed to a depth W from the surface of the first diffusion layer in which electrons are captured to the intensity of the incident light absorbed to the whole depth of the diffusion layer, and determining a current generated to the depth W.

2. The spectroscopic sensor according to claim 1, wherein the first diffusion layer comprises a p-type diffusion layer, the second diffusion layer comprises an $n^+$ diffusion layer, and the semiconductor substrate comprises an n-type semiconductor substrate.

3. The spectroscopic sensor according to claims 1, wherein the electrode film being applied with a gate voltage is a polycrystalline silicon film doped with an impurity.

4. A color image sensor without a color filter comprising a spectroscopic sensor array including the spectroscopic sensors according to claim 1 being disposed one dimensionally or two-dimensionally, wherein the spectroscopic sensor array is switched with a shift register formed with the spectroscopic sensor array to read signals, the depth for capturing electrons is varied to measure signals at each time, and the intensities of wavelengths of red, green, and blue are calculated from the signals to output color image signals.

5. The color image sensor without a color filter according to claim 4, further comprising a noise-eliminating circuit provided at an output part of the color image signals.

6. The color image sensor without a color filter according to claim 4, wherein the depth for capturing electrons is varied every 1/180 seconds.

7. The spectroscopic sensor according to claim 1, further comprising a mechanism which varies the gate voltage according to the type of the incident light.

8. The spectroscopic sensor according to claim 7, wherein the first diffusion layer comprises a p-type diffusion layer, the second diffusion layer comprises an $n^+$ diffusion layer, and the semiconductor substrate comprises an n-type semiconductor substrate.

9. The spectroscopic sensor according to claim 7, wherein the electrode film being applied with a gate voltage is a polycrystalline silicon film doped with an impurity.

10. A color image sensor without a color filter comprising a spectroscopic sensor array including the spectroscopic sensors according to claim 7 being disposed one dimensionally or two-dimensionally, wherein the spectroscopic sensor array is switched with a shift register formed with the spectroscopic sensor array to read signals, the depth for capturing electrons is varied to measure signals at each time, and the intensities of wavelengths of red, green, and blue are calculated from the signals to output color image signals.

11. A method for measuring incident light employing a semiconductor structure comprising an electrode film transmitting incident light and being applied with a gate voltage; a first diffusion layer for capturing electrons generated by the incident light, the first diffusion layer being disposed under the electrode film with an insulating film provided therebetween; a second diffusion layer for taking out electrons captured in the first diffusion layer to the outside, the second diffusion layer being disposed at one end of the first diffusion layer ; a first electrode that is connected to the second diffusion layer and that takes out the captured electrons to the outside; and a second electrode that is connected to another end opposing to the second diffusion layer disposed in the first diffusion layer and that establishes an electric potential of the first diffusion layer , wherein the gate voltage is varied, the depth from the surface of the first diffusion layer in which electrons are captured is varied on the basis of wavelength and intensity of the incident light, and a current indicating the quantity of the electrons is measured, wherein a light intensity $\Phi$ at a depth x from the surface of the first diffusion layer is determined on the basis that the light intensity is exponentially attenuated when light is incident on the first diffusion layer, the ratio of the intensity of the incident light absorbed to a depth W from the surface of the first diffusion layer, in which electrons are captured to the intensity of the incident light absorbed to the whole depth of the diffusion layer is determined, and a current generated to the depth W is determined, thereby measuring wavelength and intensity of the incident light.

12. The method for measuring incident light according to claim 11, wherein the the gate voltage is varied according to the type of the incident light.

* * * * *